United States Patent
Miyanaga (10) Patent No.: US 11,463,085 B2
(45) Date of Patent: Oct. 4, 2022

(54) SEMICONDUCTOR INTEGRATED CIRCUIT

(71) Applicant: ROHM CO., LTD., Kyoto (JP)

(72) Inventor: Koichi Miyanaga, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 17/481,885

(22) Filed: Sep. 22, 2021

(65) Prior Publication Data

US 2022/0014188 A1 Jan. 13, 2022

Related U.S. Application Data

(63) Continuation of application No. PCT/JP2020/012043, filed on Mar. 18, 2020.

(30) Foreign Application Priority Data

Mar. 22, 2019 (JP) .............................. JP2019-054504

(51) Int. Cl.
*H03K 17/687* (2006.01)

(52) U.S. Cl.
CPC .............................. *H03K 17/6871* (2013.01)

(58) Field of Classification Search
CPC .............................................. H03K 17/6871
See application file for complete search history.

(56) References Cited

U.S. PATENT DOCUMENTS

2020/0174961 A1* 6/2020 Chen ................... G06F 13/4282

FOREIGN PATENT DOCUMENTS

| JP | H05136346 A | 6/1993 |
|---|---|---|
| JP | H08293778 A | 11/1996 |
| JP | 2000036733 A | 2/2000 |
| JP | 2003133943 A | 5/2003 |
| JP | 2006060977 A | 3/2006 |
| JP | 2006304500 A | 11/2006 |
| JP | 2007028330 A | 2/2007 |
| JP | 2013198262 A | 9/2013 |
| JP | 2014187162 A | 10/2014 |

OTHER PUBLICATIONS

International Search Report for International Application No. PCT/JP2020/012043; dated Jun. 16, 2020.
PCT International Preliminary Report on Patentability with Written Opinion of the International Searching Authority for International Application No. PCT/2020/012043; dated Oct. 7, 2021.

* cited by examiner

*Primary Examiner* — Metasebia T Retebo
(74) *Attorney, Agent, or Firm* — Cantor Colburn LLP (57) ABSTRACT

A semiconductor integrated circuit includes multiple termination circuits that correspond to multiple target pins. The multiple termination circuits each include a first resistor and a first transistor coupled in series between the corresponding target pin and the ground. A second resistor is provided between the corresponding target pin and the control electrode of the first transistor. The enable circuit is arranged such that its output node is coupled to the control electrode of the first transistor, and configured such that (i) when the enable pin is set to the first state, the current is sunk from the output node, and (ii) when the enable pin is set to the second state, the output node is set to the low level.

16 Claims, 9 Drawing Sheets

SEMICONDUCTOR INTEGRATED CIRCUIT

CROSS REFERENCE TO RELATED APPLICATION

This application is a continuation under 35 U.S.C. § 120 of PCT/JP2020/012043, filed Mar. 18, 2020, which is incorporated herein reference and which claimed priority to Japanese Application No. 2019-054504, filed Mar. 22, 2019. The present application likewise claims priority under 35 U.S.C. § 119 to Japanese Application No. 2019-054504, filed Mar. 22, 2019, the entire content of which is also incorporated herein by reference

BACKGROUND

1. Technical Field

The present disclosure relates to a termination circuit.

2. Description of the Related Art

Battery-driven devices such as cellular phone terminals, smartphones, tablet terminals, laptop computers, and portable audio players each include a rechargeable secondary battery and a charger circuit that charges the secondary battery as built-in components. Known examples of such charger circuits include an arrangement that charges a secondary battery using a DC voltage (bus voltage $V_{BUS}$) supplied from an external circuit via a USB cable or a DC voltage from an external AC adapter.

At present, as a charger circuit mounted on a mobile device, charger circuits that conform to a specification which is referred to as the "USB Battery Charging Specification" (which will be referred to as the "BC specification" hereafter) have become mainstream. There are several kinds of USB hosts or USB chargers (which will collectively be referred to as a "USB power supply apparatus" hereafter). As the kinds of USB power supply apparatuses that conform to revision 1.2 of the BC specification, Standard Downstream Port (SDP), Dedicated Charging Port (DCP), and Charging Downstream Port (CDP) have been defined. The current (current capacity) that can be provided by a USB power supply apparatus is defined according to the kind of USB power supply apparatus. Specifically, DCP and CDP are defined to provide a current capacity of 1500 mA. Also, SDP is defined to provide a current capacity of 100 mA, 500 mA, or 900 mA, according to the USB version.

As a secondary battery charging method or system using USB, a specification which is referred to as the "USB Power Delivery Specification" (which will be referred to as the "USB-PD specification" hereafter) has been developed. The USB-PD specification allows the available power to be dramatically increased up to a maximum of 100 W, as compared with the BC standard, which provides a power capacity of 7.5 W. Specifically, the USB-PD specification allows a USB bus voltage that is higher than 5 V (specifically, 9 V, 12 V, 15 V, 20 V, etc.). Furthermore, the USB-PD specification allows a charging current that is greater than that defined by the BC specification (specifically, the USB-PD specification allows a charging current of 2 A, 3 A, 5 A, etc.). The USB-PD specification is employed in the USB Type-C specification.

Figure 1:
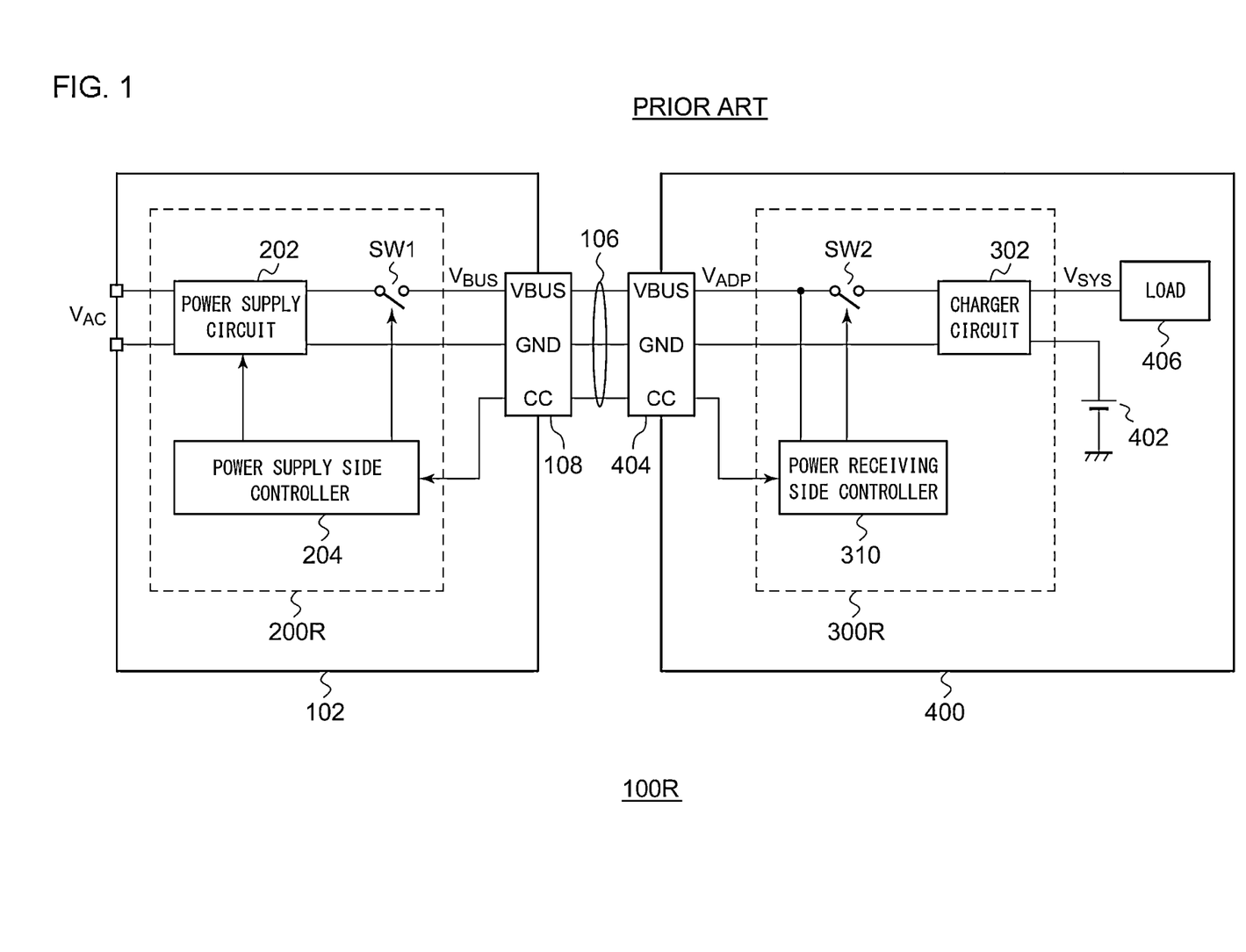
FIG. 1 is a block diagram showing a power supply system.

FIG. 1 is a block diagram showing a power supply system 100R. The power supply system 100R conforms to the USB Type-C specification, and includes a power supply apparatus 200R and a power receiving apparatus 300R coupled via a USB cable 106. For example, the power supply apparatus 200R is mounted on an AC adapter 102, or, is mounted on an electronic device. The power receiving apparatus 300R is mounted on a battery-driven electronic device 400 such as a smartphone, tablet terminal, digital still camera, digital video camera, portable audio player, or the like.

The power supply apparatus 200R includes a power supply circuit 202, a power supply side PD controller (which will be referred to as the "power supply side controller" hereafter) 204, and a bus switch SW1. The USB cable 106 is detachably coupled to a receptacle 108 provided to the electronic device 400. It should be noted that such a receptacle 108 may be omitted. That is to say, charger adapters are known having a configuration in which the USB cable 106 and the AC adapter 102 are monolithically integrated.

The receptacle 108 includes a $V_{BUS}$ terminal configured to supply a bus voltage $V_{BUS}$, a GND terminal configured to supply a ground voltage VGND, and a Configuration Channel (CC) port. In actuality, the receptacle 108 is provided with two CC ports. However, FIG. 1 shows a simple example of the receptacle 108 provided with a single CC port. The power supply circuit 202 generates the bus voltage $V_{BUS}$. The power supply circuit 202 may include an AC/DC converter that receives an AC voltage of 100 V from an unshown external power supply (e.g., a commercially available AC power supply), and that converts the AC voltage thus received into the bus voltage $V_{BUS}$ in the form of a DC voltage. The bus voltage $V_{BUS}$ generated by the power supply circuit 202 is supplied to the power receiving apparatus 300R via a bus line of the USB cable 106 and the bus switch SW1.

The power supply side controller 204 and a power receiving side controller 310 are each configured as a port controller that conforms to the USB Type-C specification. The power supply side controller 204 and the power receiving side controller 310 are coupled via a CC line, which provides a communication function between them. Negotiation is performed between the power supply side controller 204 and the power receiving side controller 310 with respect to the voltage level of the bus voltage $V_{BUS}$ to be supplied from the power supply apparatus 200R. The power supply side controller 204 controls the power supply circuit 202 so as to supply electric power with the voltage level thus determined, and controls on/off operations of the bus switch SW1.

The electronic device 400 includes a battery 402, a receptacle 404, a load (system) 406, and the power receiving apparatus 300R. The battery 402 is configured as a rechargeable secondary battery. The load circuit 406 includes a CPU, memory, liquid crystal display, audio circuit, etc. The AC adapter 102 is detachably coupled to the receptacle 404 via the USB cable 106.

The power receiving apparatus 300R receives power from the adapter 102, and charges the charger circuit 302. The power receiving apparatus 300R includes the charger circuit 302, the power receiving side controller 310, and a bus switch SW2.

The charger circuit 302 receives the bus voltage $V_{BUS}$ (which will also be referred to as the "adapter voltage $V_{ADP}$" on the power receiving apparatus 300R side) from the power supply apparatus 200R via the USB cable 106 and the bus switch SW2, so as to charge the battery 402. The charger circuit 302 is configured as a step-down DC/DC converter, a linear regulator, or a combination of such components.

A system voltage $V_{SYS}$ is supplied from the charger circuit 302 to the load circuit 406 according to at least one of the adapter voltage $V_{ADP}$ and the voltage $V_{BAT}$ supplied from the battery 402. Examples of such a load circuit 406 include power management ICs (Integrated Circuits), multi-channel power supplies each including a DC/DC converter, linear regulator or the like, microcontrollers, liquid crystal displays, display drivers, and so forth.

The power receiving side controller 310 holds data (request PDO: Power Data Object) that defines the bus voltage $V_{BUS}$ and the maximum current to be requested by the power receiving apparatus 300R. After the AC adapter 102 and the electronic device 400 are coupled, negotiation is performed between the power supply side controller 204 and the power receiving side controller 310. As a result, the voltage level of the bus voltage $V_{BUS}$ is determined based on the request PDO. Furthermore, the power receiving side controller 310 controls the on/off operations of the bus switch SW2.

Figure 2:
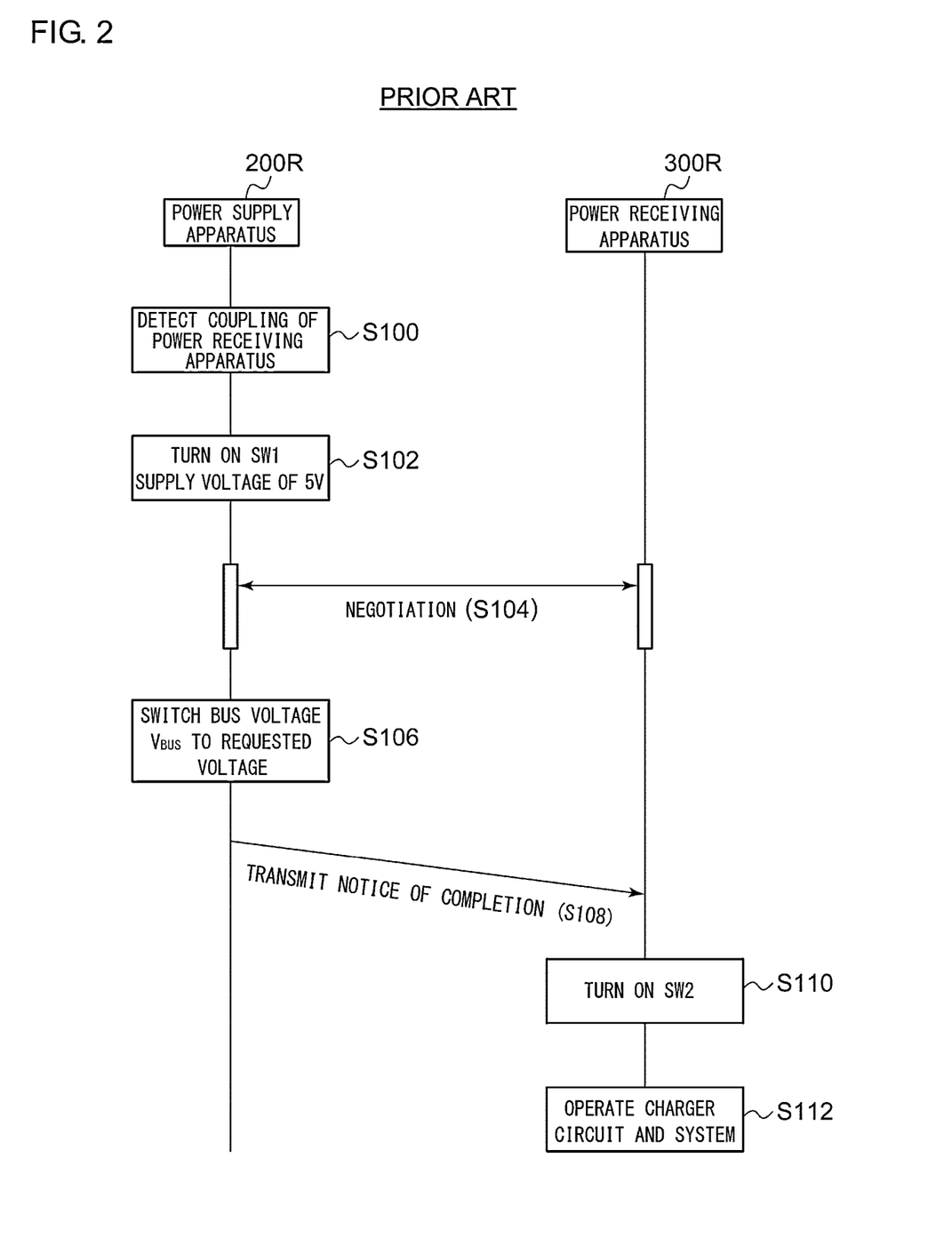
FIG. 2 is an operation sequence diagram showing the operation of the power supply system shown in FIG. 1.

FIG. 2 is an operation sequence diagram showing the operation of the power supply system 100 shown in FIG. 1. After the power supply apparatus 200R and the power receiving apparatus 300R are coupled via the USB cable 106, the power supply side controller 204 detects this coupling based on the state of the CC port (S100). Specifically, the power receiving side controller 310 of the power receiving apparatus 300R stands by in a state in which the CC port is pulled down by a pulldown resistor (terminal resistor) Rd having a predetermined resistance value. When the power supply apparatus 200R and the power receiving apparatus 300R are coupled, a voltage occurs at the CC port of the power supply apparatus 200R corresponding to the pulldown resistor Rd on the power receiving apparatus 300R side and the state of the power receiving apparatus 200R itself. With this, the power supply side controller 204 of the power supply apparatus 200R is able to detect the coupling of the power receiving apparatus 300R (electronic device 400).

Subsequently, the bus switch SW1 is turned on (S102). In this state, the power supply system 100 supplies the bus voltage $V_{BUS}$ of 5 V, which is a default value. After the bus switch SW1 is turned on, the power receiving side controller 310 enters the operable state.

Next, negotiation is performed between the power supply side controller 204 and the power receiving side controller 310, and the bus voltage $V_{BUS}$ is determined based on the requested voltage (S104). The power supply side controller 204 switches the bus voltage $V_{BUS}$ to the requested voltage from the initial voltage of 5 V (S106).

After completing the switching of the bus voltage $V_{BUS}$ to the requested voltage, the power supply side controller 204 transmits a notice thereof to the power receiving side controller 310 (S108). The power receiving side controller 310 turns on the bus switch SW2 in response to the notice thus received (S110). As a result, the bus voltage $V_{BUS}$ is supplied to the charger circuit 302 and the load circuit 406 (S112).

Figure 3:
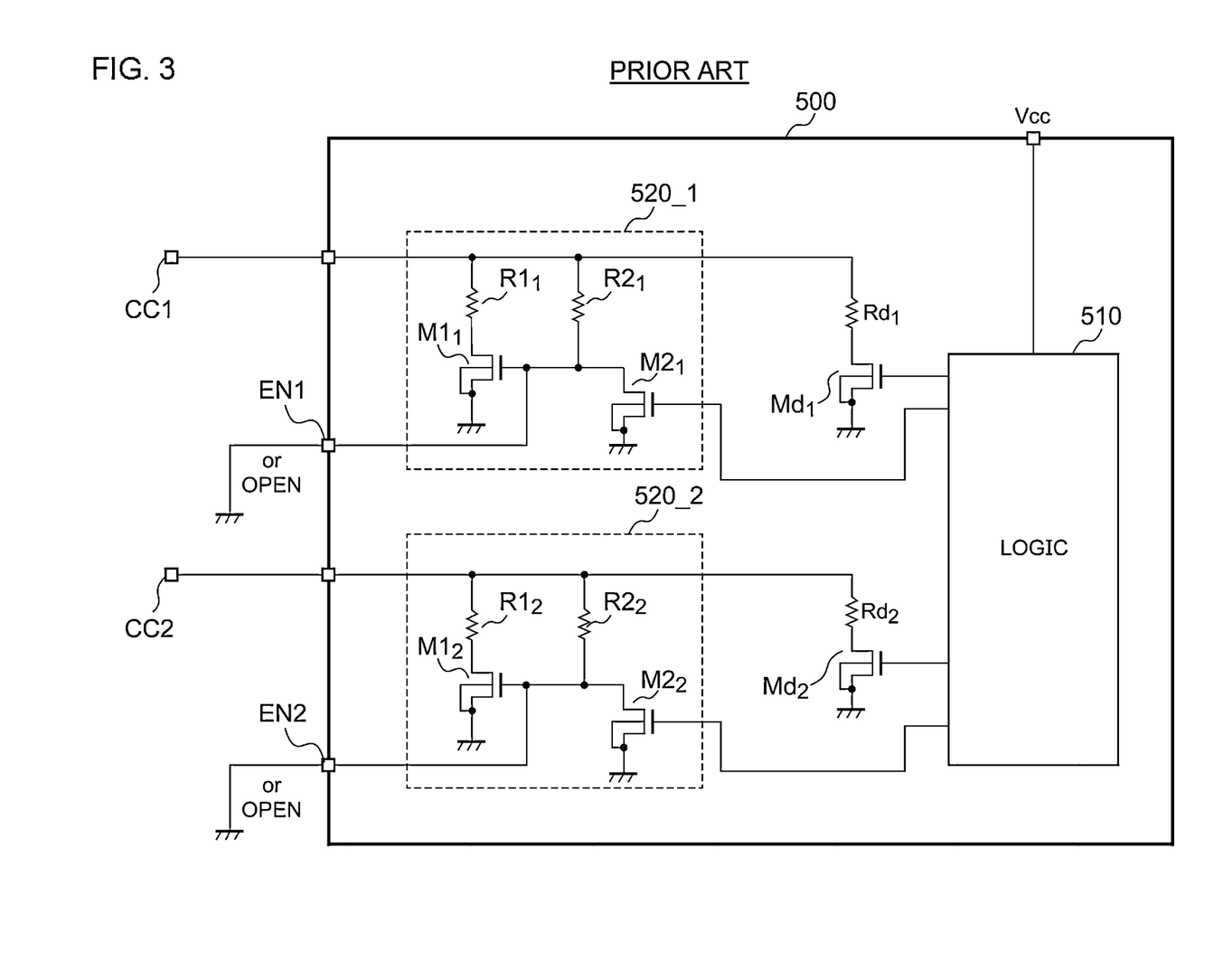
FIG. 3 is a circuit diagram showing a PD controller.

FIG. 3 is a circuit diagram showing a PD controller 500. The PD controller 500 includes a logic circuit 510, pulldown resistors $Rd_1$ and $Rd_2$, and transistors $Md_1$ and $Md_2$.

The logic circuit 510 controls the on/off operations of the transistors $Md_1$ and $Md_2$. When the transistors $Md_1$ and $Md_2$ are turned on, the CC1 port and the CC2 port are pulled down by the resistors $Rd_1$ and $Rd_2$, respectively.

Description will be made regarding a case in which the PD controller 500 is mounted on the electronic device 400 shown in FIG. 1, and is used as the power receiving side controller 310. The logic circuit 510 operates using the voltage supplied to the power supply terminal VCC of the PD controller 500 as its power supply. When the battery 402 is in a dead battery state in which the remaining battery charge is zero, the logic circuit 510 is not able to operate. In this state, the transistors $Md_1$ and $Md_2$ cannot be turned on. In order to solve this problem, the PD controller 500 is provided with voltage clamp circuits 520_1 and 520_2.

In the dead battery state, the voltage clamp circuits 520_1 and 520_2 become active. In this state, the CC1 port and the CC2 port are pulled down by the pulldown resistors $R2_1$ and $R2_2$. The voltage clamp circuits 520_1 and 520_2 have the same configuration.

Each voltage clamp circuit 520_# (#=1, 2) includes resistors $R1_\#$ and $R2_\#$ and transistors $M1_\#$ and $M2_\#$. When there is a remaining battery charge such that the logic circuit 510 is able to operate, the transistor $M2_\#$ is turned on and the transistor $M1_\#$ is turned off, thereby setting the voltage clamp circuit 520_# to the inactive state.

When the logic circuit 510 is not able to operate in the dead battery state, such an arrangement is not able to maintain the transistor $M2_\#$ in the on state. The off state of the transistor $M2_\#$ corresponds to the active state of the voltage clamp circuit 520_#. When the power supply side controller 204 is coupled to the corresponding CC # port, the gate of the transistor $M1_\#$ is pulled up via the resistor $R2_\#$, thereby turning on the transistor $M1_\#$. In this state, the resistor $R1_\#$ is coupled to the CC # port as a terminal resistor.

The PD controller 500 is configured to be capable of operating as both the power supply side controller 204 and the power receiving side controller 310 shown in FIG. 1. In a case in which the PD controller 500 is employed as the power supply side controller 204, the dead battery state does not occur. Accordingly, the functions of the voltage clamp circuit 520_1 and 520_2 are preferably suspended (disabled). In order to disable the functions, the gate of each transistor $M1_\#$ is coupled to the corresponding enable pin EN #. Upon coupling the enable pin EN # to an external ground, the transistor $M1_\#$ is fixedly turned off, thereby disabling the voltage clamp circuit 520_#. In contrast, in a case in which the PD controller 500 is employed as the power receiving side controller 310, the enable pin EN # is preferably open.

The setting of the state (enable/disable) is common for the voltage clamp circuits 520_1 and 520_2. Accordingly, ideally, only a single enable pin EN is required to set the settings of the voltage clamp circuits 520_1 and 520_2. However, the gates of the transistors $M1_1$ and $M1_2$ cannot be coupled to a single common enable pin EN. This is because such an arrangement would lead to the occurrence of mutual interference between the voltage clamp circuits 520_1 and 520_2.

SUMMARY

The present disclosure has been made in order to solve such a problem.

An embodiment of the present disclosure relates to a semiconductor integrated circuit. The semiconductor integrated circuit includes: multiple target pins to be terminated; an enable pin; and multiple termination circuits that correspond to the multiple target pins. The multiple termination circuits each include: a first resistor and a first transistor coupled in series between the corresponding target pin and the ground; a second resistor coupled between the corresponding target pin and a control electrode of the first transistor; and an enable circuit arranged such that an output node thereof is coupled to the control electrode of the first transistor, and structured such that (i) when the enable pin is set to a first state, the enable circuit sinks a current from the output node, and (ii) when the enable pin is set to a second state, the enable circuit fixedly sets the output node to a low level.

An embodiment of the present disclosure relates to a semiconductor integrated circuit. The semiconductor integrated circuit includes: multiple target pins to be terminated; an enable pin; and multiple termination circuits that correspond to the multiple target pins. The multiple termination circuits each include: a first resistor and a first transistor coupled in series between a corresponding target pin and the ground; a second resistor coupled between the corresponding target pin and a control electrode of the first transistor; and an enable circuit arranged such that an output node thereof is coupled to the control electrode of the first transistor, and structured such that (i) when the enable pin is set to a first state, the enable circuit has an output impedance that is larger than that of the second resistor, and (ii) when the enable pin is set to a second state, the enable circuit has the output impedance that is smaller than that of the second resistor.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION

Outline of Embodiments

A summary of several example embodiments of the disclosure follows. This summary is provided for the convenience of the reader to provide a basic understanding of such embodiments and does not wholly define the breadth of the disclosure. This summary is not an extensive overview of all contemplated embodiments, and is intended to neither identify key or critical elements of all embodiments nor to delineate the scope of any or all aspects. Its sole purpose is to present some concepts of one or more embodiments in a simplified form as a prelude to the more detailed description that is presented later. For convenience, the term "one embodiment" may be used herein to refer to a single embodiment or multiple embodiments of the disclosure.

One embodiment disclosed in the present specification relates to a semiconductor integrated circuit. The semiconductor integrated circuit includes: multiple target pins to be terminated; an enable pin; and multiple termination circuits that correspond to the multiple target pins. The multiple termination circuits each include: a first resistor and a first transistor coupled in series between the corresponding target pin and the ground; a second resistor coupled between the corresponding target pin and a control electrode of the first transistor; and an enable circuit coupled such that an output node thereof is coupled to the control electrode of the first transistor, and structured such that (i) when the enable pin is set to a first state, the enable circuit sinks a current from the output node, and (ii) when the enable pin is set to a second state, the enable circuit fixedly sets the output node to a low level.

When the enable pin is set to the first state, a voltage drop occurs across the second resistor due to a current sunk by the enable circuit. This generates a voltage at the control electrode of the first transistor such that it is slightly lower than the voltage of the target pin, thereby turning on the first transistor. That is to say, the termination circuit is set to the enable state. When the enable pin is set to the second state, the output node, i.e., the control electrode of the first transistor, is fixedly set to the low level, thereby fixedly setting the first transistor to the off state. That is to say, the termination circuit is set to the disable state. With the embodiment, the enable circuit is provided so as to suppress mutual interference between the multiple termination circuits. This allows the enable states and the disable states of the multiple termination circuits to be set using a single enable pin.

From another viewpoint, it can be said that the enable circuit is configured such that (i) when the enable pin is set to the first state, the enable circuit has an output impedance that is larger than that of the second resistor, and (ii) when the enable pin is set to the second state, the enable circuit has an output impedance that is smaller than that of the second resistor.

In one embodiment, the enable circuit may include: a second transistor coupled between the output node and the ground; and a bias circuit structured to change a state of the second transistor according to a state of the enable pin.

In one embodiment, the bias circuit may be configured such that when the enable pin is set to the first state, the bias circuit applies a relatively low voltage to a control electrode of the second transistor, and when the enable pin is set to the second state, the bias circuit applies a relatively high voltage to the control electrode of the second transistor. This allows the output impedance of the enable circuit to be changed.

In one embodiment, the bias circuit may include: a third resistor coupled such that one end thereof is coupled to the target pin; and a third transistor coupled such that a high-voltage side electrode thereof and a control electrode thereof are coupled to the other end of the third resistor, and a low-voltage side electrode thereof is coupled to the enable pin.

In one embodiment, a back gate of the third transistor may be grounded. With this, a body diode is generated between the back gate and the source of the third transistor. This allows the isolation between the multiple target pins to be improved.

In one embodiment, the enable circuit may include a current mirror circuit structured to mirror a current that flows from the target pin to the enable pin so as to sink a current from the output node. When the enable pin is grounded, a current flows to the input side of the current mirror circuit. The current mirror circuit mirrors the current thus input, thereby sinking a current from the output node. When the enable pin is open, no current flows to the input side of the current mirror circuit. In this state, the output node is set to the low level.

In one embodiment, the enable pin may be set to a low or a high impedance state.

In one embodiment, the multiple termination circuits may each include a Zener diode provided between the control electrode of the first transistor and the ground. This allows the circuit elements to be protected.

EMBODIMENTS

Description will be made below regarding the present disclosure based on preferred embodiments with reference to the drawings. The same or similar components, members, and processes are denoted by the same reference numerals, and redundant description thereof will be omitted as appropriate. The embodiments have been described for exemplary purposes only, and are by no means intended to restrict the present disclosure. Also, it is not necessarily essential for the present disclosure that all the features or a combination thereof be provided as described in the embodiments.

In the present specification, the state represented by the phrase "the member A is coupled to the member B" includes a state in which the member A is indirectly coupled to the member B via another member that does not substantially affect the electric connection between them, or that does not damage the functions or effects of the connection between them, in addition to a state in which they are physically and directly coupled.

Similarly, the state represented by the phrase "the member C is provided between the member A and the member B" includes a state in which the member A is indirectly coupled to the member C, or the member B is indirectly coupled to the member C via another member that does not substantially affect the electric connection between them, or that does not damage the functions or effects of the connection between them, in addition to a state in which they are directly coupled.

Figure 4:
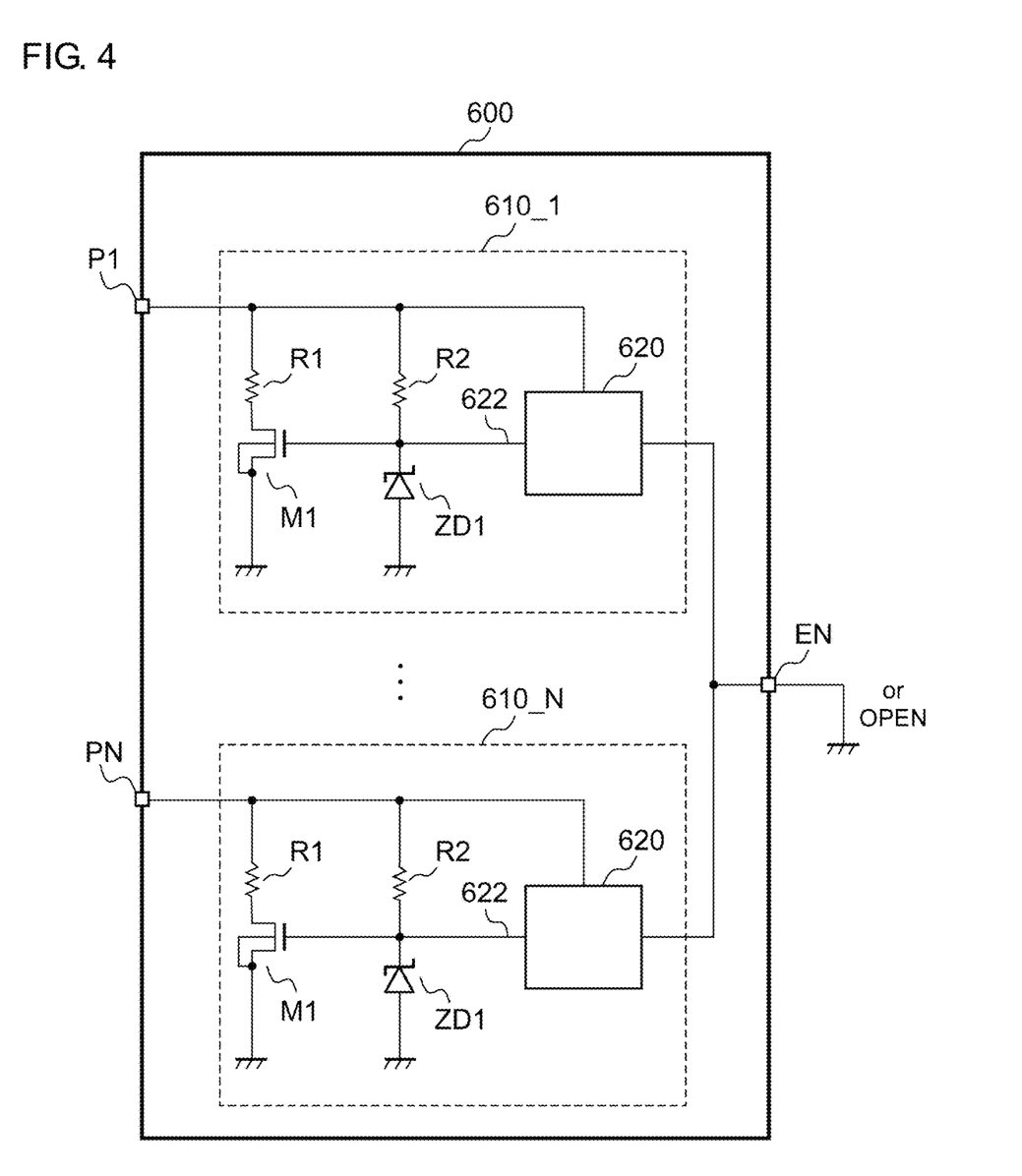
FIG. 4 is a circuit diagram showing a semiconductor integrated circuit according to an embodiment.

FIG. 4 is a circuit diagram showing a semiconductor integrated circuit 600 according to an embodiment. The semiconductor integrated circuit 600 includes a plurality of N (N≥2) target pins P1 through PN to be terminated, an enable pin EN, and multiple termination circuits 610_1 through 610_N that correspond to the multiple target pins P1 through PN. The multiple termination circuits 610_1 through 610_N have the same configuration.

The multiple termination circuits 610_# (#=1, N) each include a first resistor R1, a first transistor M1, a second resistor R2, a Zener diode ZD1, and an enable circuit 620. The first resistor R1 and the first transistor M1 are coupled in series between the corresponding target pin P # and the ground. The second resistor R2 is coupled between the corresponding target pin P # and the control electrode (gate) of the first transistor M1.

The enable circuit 620 is arranged such that its output node 622 is coupled to the gate of the first transistor M1. The enable circuit 620 is configured such that: (i) when the enable pin EN is set to the first state (e.g., grounded), the enable circuit 620 sinks the current Is from the output node 622, and such that (ii) when the enable pin EN is set to the second state (e.g., open), the output node 622 is fixedly set to the low state.

The Zener diode ZD1 is coupled between the gate of the first transistor M1 and the ground.

Figure 5:
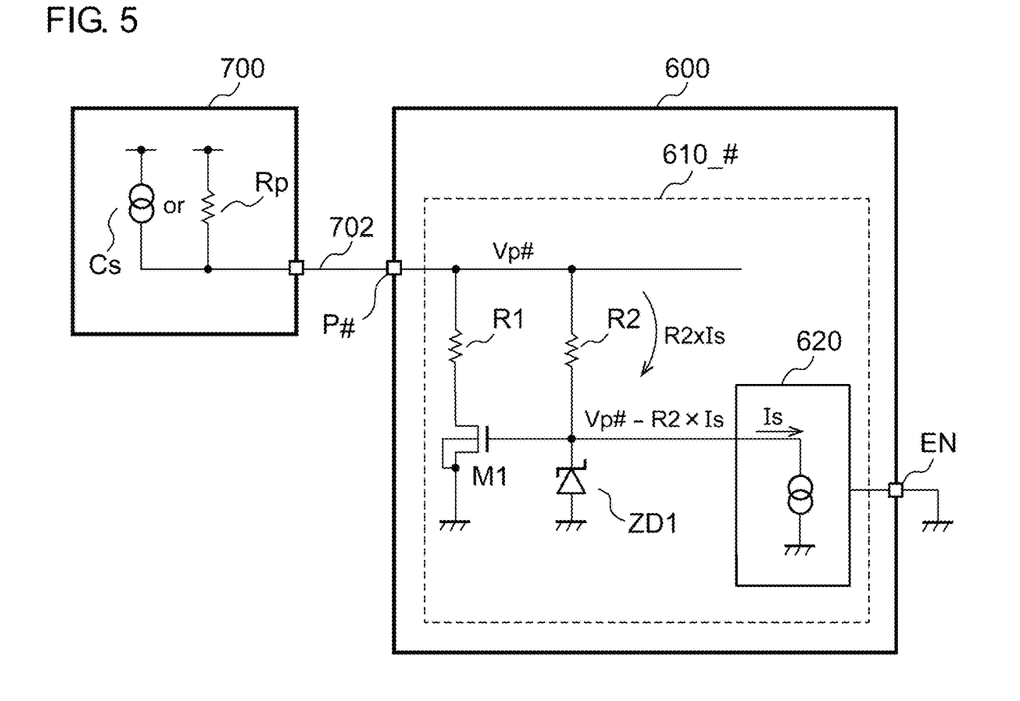
FIG. 5 is an equivalent circuit diagram of the semiconductor when an enable pin EN is set to the first state.

The above is the configuration of the semiconductor integrated circuit 600. Next, description will be made regarding the operation thereof. FIG. 5 is an equivalent circuit diagram showing the semiconductor integrated circuit 600 when the enable pin EN is set to the first state. In this drawing, only the pin P # and a portion relating to the pin P # are shown. When the semiconductor integrated circuit 600 is used, the target pin P # of the semiconductor integrated circuit 600 is coupled to the pin 704 of an external circuit 700 via wiring 702. In the interior of the external circuit 700, the pin 704 is pulled up by a pullup resistor Rp. Otherwise, the pin 704 is coupled to a source current source CS. Description will be made with the voltage at the target pin P # in this state as Vp #.

The enable circuit 620 sinks the current Is, thereby generating the voltage drop represented by (R2×Is) across the second resistor R2. Accordingly, the gate voltage Vg1 of the first transistor M1 is represented by (Vp #−R2×Is).

The resistance value R2 and the amount of current Is are determined such that Vg1<Vgs(th) holds true, i.e., Vp #−R2×Is >Vgs(th) holds true. Here, Vgs(th) represents the gate-source threshold voltage of the N-channel Metal Oxide Semiconductor Field Effect Transistor (MOSFET). This allows the first transistor M1 to be turned on. That is to say, the target pin P # is terminated (pulled down) by the resistor R1. In this state, the termination circuit 610_# is set to the enable state.

Figure 6:
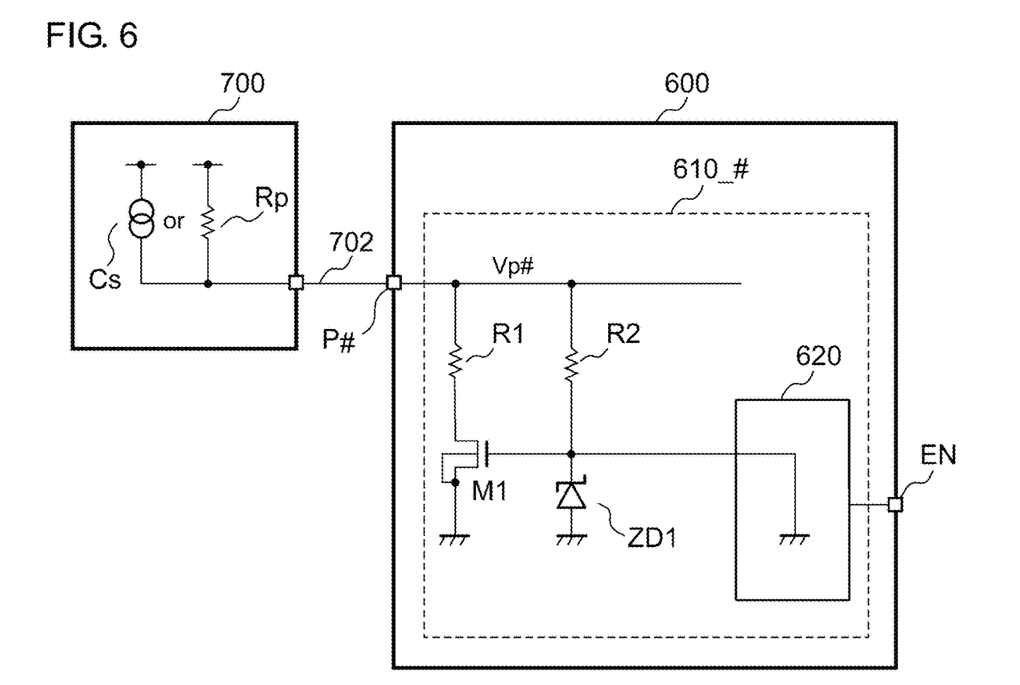
FIG. 6 is an equivalent circuit diagram of the semiconductor when the enable pin EN is set to the second state.

FIG. 6 is an equivalent circuit showing the semiconductor integrated circuit 600 when the enable pin EN is set to the second state.

In the second state, the output impedance of the enable circuit 620 becomes sufficiently smaller than the resistance value of the second resistor R2. In this state, the output node 622 of the enable circuit 620 is fixed to the low level (in the vicinity of the ground voltage 0 V). This allows the first transistor M1 to be turned off. In this state, the target pin P # is not terminated (pulled down) via the resistor R1. Accordingly, the termination circuit 610_# is set to the disable state.

The above is the operation of the semiconductor integrated circuit 600. With the semiconductor integrated circuit 600, the enable states and the disable states of the multiple termination circuits 610_1 through 610_N can be set to the enable state or the disable state using a single enable pin EN. With such an arrangement in which the enable circuit 620 is provided between the gate of the first transistor M1 and the enable pin EN, this is capable of suppressing mutual interference between the multiple termination circuits 610_1 through 610_N.

Furthermore, with such an arrangement in which the Zener diode ZD1 is provided, this is capable of clamping the voltage at the gate of the first transistor M1 and the output node of the enable circuit 620 when high voltage occurs at the target pin P #. This allows the first transistor M1 and the internal elements of the enable circuit 620 to be protected.

Figure 7:
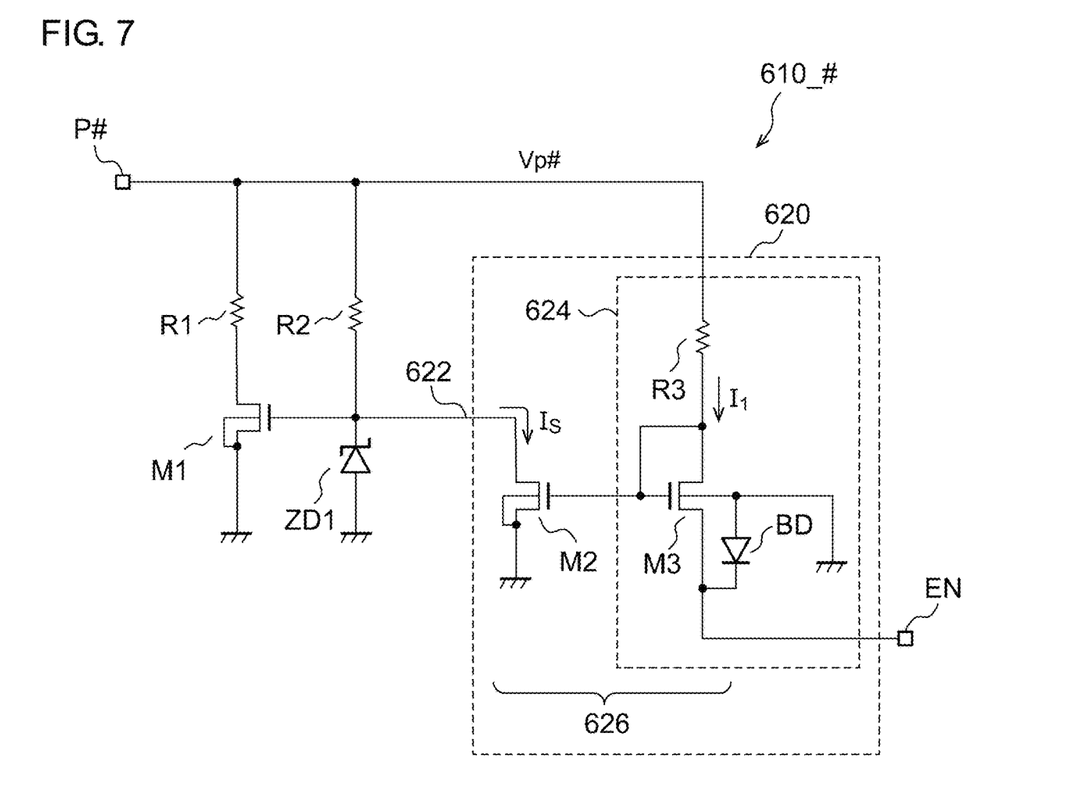
FIG. 7 is a circuit diagram showing a specific example configuration of a bias circuit.

FIG. 7 is a circuit diagram showing a specific example configuration of the enable circuit 620. The enable circuit 620 includes a second transistor M2 coupled between the output node 622 and the ground and a bias circuit 624 that changes the state of the second transistor M2 according to the state of the enable pin EN.

The enable circuit 620 is configured such that, when the enable pin EN is set to the first state (short circuit), the enable circuit 620 applies a relatively low voltage $V_L$ to the gate of the second transistor M2, and such that, when the enable pin EN is set to the second state (open), the enable circuit 620 applies a relatively high voltage $V_H$ to the gate of the second transistor M2.

The bias circuit 624 includes a third resistor R3 and a third transistor M3. One end of the third resistor R3 is coupled to the target pin P #. The third transistor M3 is arranged such that the high-voltage side electrode (drain) and the control electrode (gate) are coupled to the other end of the third resistor R3, and the low-voltage side electrode (source) is coupled to the enable pin EN.

Preferably, the back gate of the third transistor M3 is grounded. With this, the body diode BD is provided between the back gate and the source of the third transistor M3. This allows isolation to be improved between the multiple target pins P # (#=1 to N).

The above is an example configuration of the termination circuit 610. Next, description will be made regarding the operation thereof. The transistors M2 and M3 form a current mirror circuit 626. Description will be made with the size ratio between the transistors M2 and M3 as 1:N. The current mirror circuit 626 mirrors the current $I_1$ that flows from the target pin P # to the enable pin EN. This sinks the current Is that is 1 over N of $I_1$ (=$I_1$/N) from the output node 622.

In the first state in which the enable pin EN is grounded, the current path (the third resistor R3 and the third transistor M3) from the target pin P # to the ground is enabled, whereby the current $I_1$ flows. This sinks the current Is which is proportional to the current $I_1$ from the output node 622. This generates a high voltage at the gate of the first transistor M1, thereby turning on the first transistor M1.

In the second state in which the enable pin EN is open (or is maintained at a high electric potential), there is no current path from the target pin P # to the ground. Accordingly, the current $I_1$ does not flow. In this state, the gate of the second transistor M2 is pulled up to the high voltage Vp # via the third resistor R3. In this state, the second transistor M2 is fully turned on, thereby fixedly setting the gate of the first transistor M1 to the low level.

Figure 8:
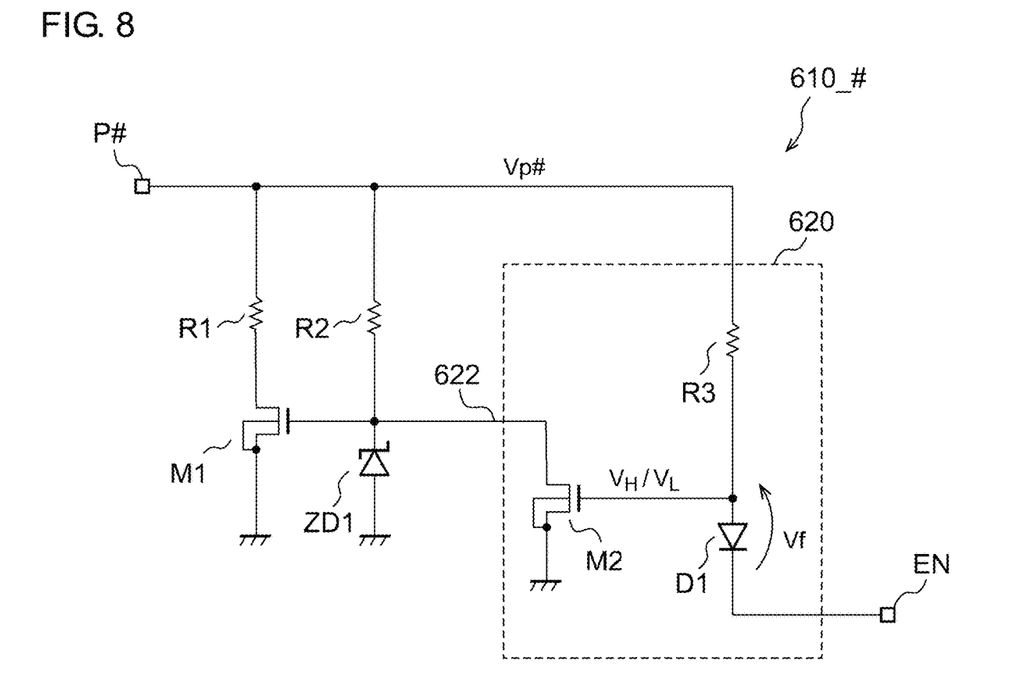
FIG. 8 is a circuit diagram showing another example configuration of the termination circuit.

FIG. 8 is a circuit diagram showing another example configuration of the termination circuit 610_#. In FIG. 8, the third transistor M3 shown in FIG. 7 is replaced by a rectifier circuit D1. The rectifier circuit D1 includes a single diode or multiple diodes coupled in series. The rectifier circuit D1 can be regarded as a constant voltage source configured such that, when the enable pin EN is grounded, the rectifier circuit D1 generates a voltage difference ΔV (=Vf).

When the enable pin EN is grounded, a forward voltage Vf of the rectifier circuit D1 is applied to the gate of the second transistor M2. Vf may preferably be designed such that an appropriate sink current Is flows through the second transistor M2.

When the enable pin EN is open, the high voltage Vp # of the target pin P # is applied to the gate of the second transistor M2 via the third resistor R3. In this state, the second transistor M2 is fully turned on.

It should be noted that, in an application in which the high voltage Vp # of the target pin P # is defined beforehand, the rectifier circuit D1 may be replaced by a resistor (which will be referred to as a "resistor R4"). When the enable pin EN is grounded, the voltage Vp # is divided by a voltage dividing circuit formed of the resistors R3 and R4. The voltage thus divided, represented by $V_L$=Vp #×R4/(R3+R4), is applied to the gate of the second transistor M2.

Figure 9:
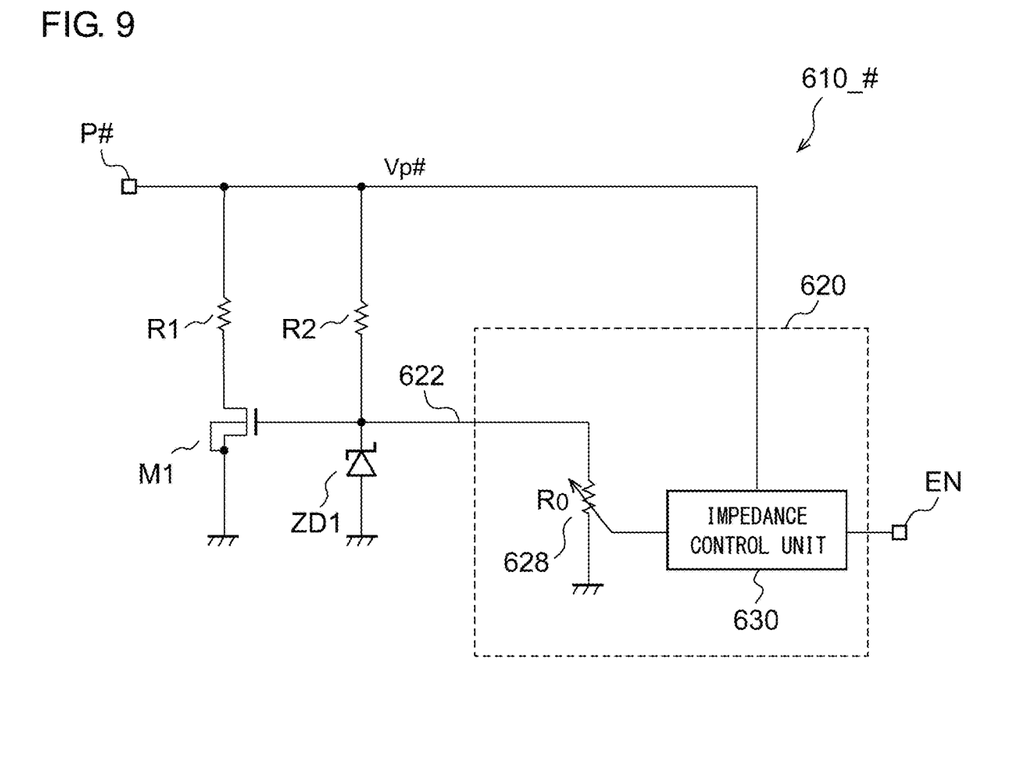
FIG. 9 is a circuit diagram showing yet another example configuration of the termination circuit.

In FIGS. 7 and 8, the second transistor M2 may also be regarded as a variable impedance element. From this viewpoint, the termination circuit 610 can be regarded as an arrangement as shown in FIG. 9. FIG. 9 is a circuit diagram showing another example configuration of the termination circuit 610_#.

The enable circuit 620 is configured such that (i) when the enable pin EN is set to the first state, the enable circuit 620 has an output impedance Ro1 that is larger than the second resistor R2, and such that (ii) when the enable pin EN is set to the second state, the enable circuit 620 has an output impedance Ro2 that is smaller than the second resistor R2.

The gate voltage Vg1 of the first transistor M1 is represented by Vg1=Vp #×Ro/(R2+Ro). When Ro1>>R2, the gate voltage Vg1 becomes higher, thereby turning on the first transistor M1. When Ro2<<R2, the gate voltage Vg1 becomes lower, thereby turning off the first transistor M1.

The enable circuit 620 includes a variable impedance element 628 coupled between the output node 622 and the ground and an impedance control unit 630 that controls the impedance of the variable impedance element 628 (i.e., the output impedance Ro of the enable circuit 620). The impedance control unit 630 changes the impedance Ro of the variable impedance element 628 according to the state of the enable pin EN.

Figure 10:
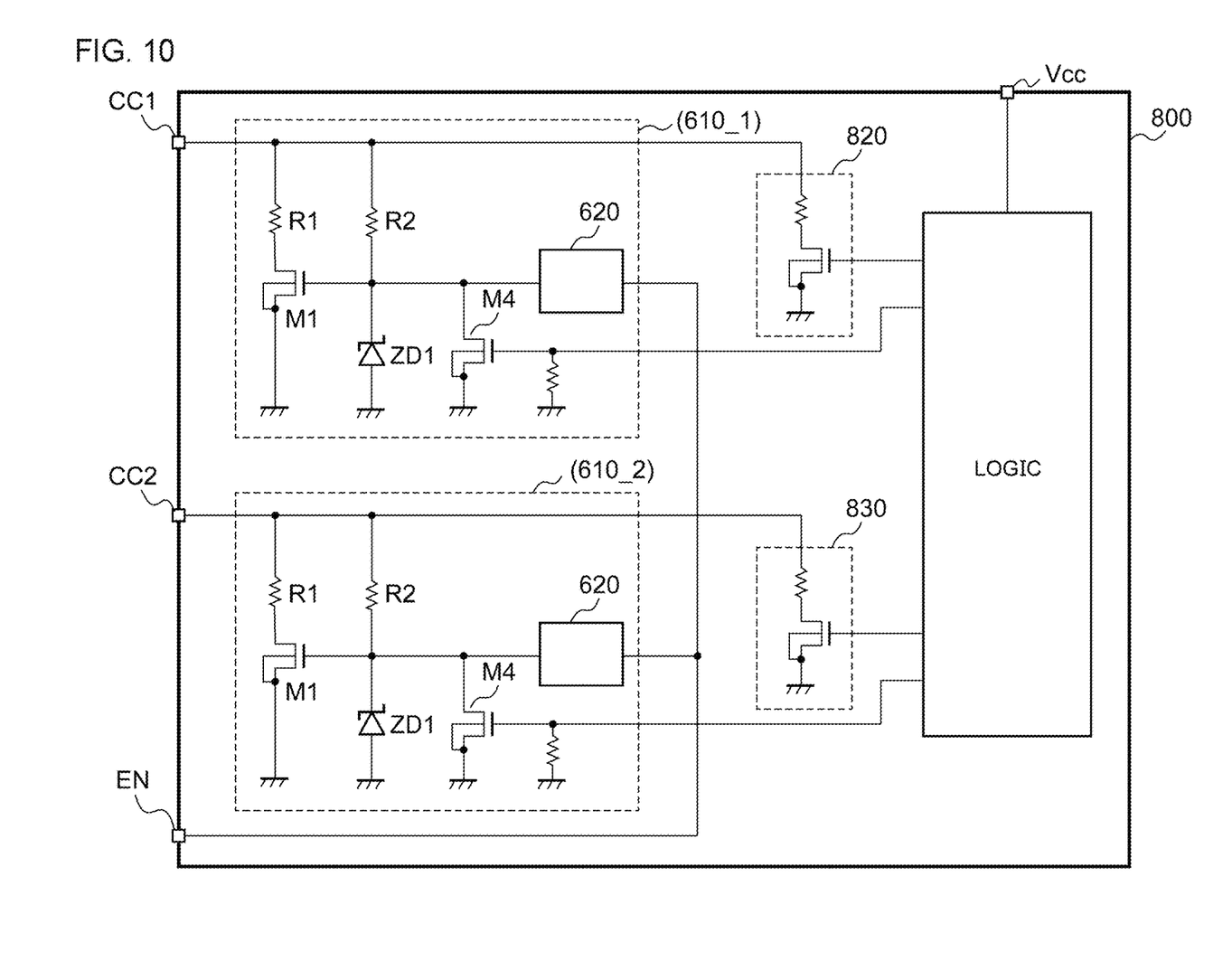
FIG. 10 is a circuit diagram showing a USBPD controller.

Next, description will be made regarding the usage of the semiconductor integrated circuit 600. FIG. 10 is a circuit diagram showing a Universal Serial Bus (USB) Power Deliver (PD) controller 800. The PD controller 800 is employed as the power receiving side controller 310 or the power supply side controller 204 shown in FIG. 1.

The PD controller 800 includes two Configuration Channel (CC) pins CC1 and CC2. The PD controller 800 is provided with a logic circuit 810, pulldown circuits 820_1 and 820_2, and voltage clamp circuits 830_1 and 830_2.

A battery voltage or a power supply voltage generated based on the battery voltage is supplied to the power supply terminal VCC of the logic circuit 810. When the power supply voltage is higher than an Undervoltage Lockout (UVLO) threshold value, the logic circuit 810 controls the states of the pulldown circuits 820_1 and 820_2. Furthermore, a fourth transistor M4 included in each of the voltage clamp circuits 830_1 and the 830_2 is fixedly set to the on level, so as to disable the voltage clamp circuits 830_1 and 830_2.

The voltage clamp circuits 830_1 and 830_2 each correspond to the termination circuit 610 described above. The voltage clamp circuits 830_1 and 830_2 are coupled to a common enable pin EN, so as to control the enable/disable state. In a case in which the PD controller 800 is mounted on a sink device, the enable pin EN is set to the first state. With this, in a dead battery state in which the logic circuit 810 is not able to operate, this allows the CC1 pin and CC2 pin to be pulled down.

In a case in which the PD controller 800 is mounted on a source device, the enable pin EN is set to the second state. In this state, the voltage clamp circuits 830_1 and 830_2 are set to the disable state.

Usage

Figure 11:
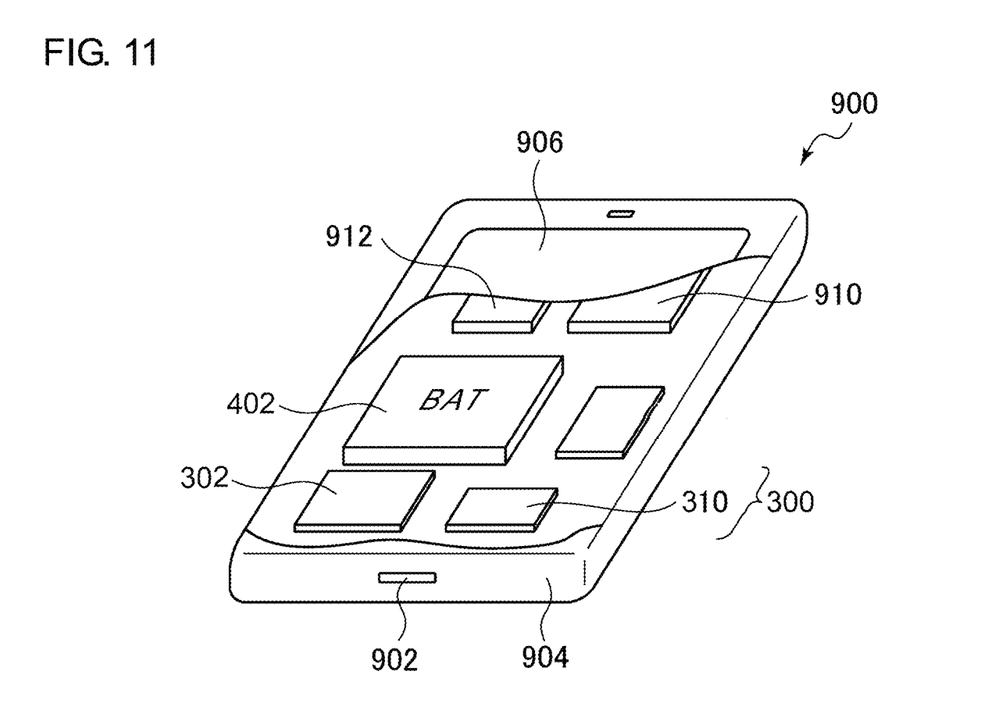
FIG. 11 is a diagram showing an electronic device provided with a power receiving apparatus.

Lastly, description will be made regarding the usage of the power receiving apparatus 300. FIG. 11 is a diagram showing an electronic device 900 provided with the power receiving apparatus 300. The electronic device 900 described as an example is configured as a smartphone or a tablet terminal. The electronic device 900 includes a receptacle 902, a housing 904, a display panel 906, a CPU 910, and a baseband IC 912 in addition to the battery 402 and the power receiving apparatus 300 described above. The power receiving apparatus 300 receives the bus voltage supplied to the receptacle 902, and charges the battery 402. Furthermore, the power receiving apparatus 300 supplies the power supply voltage to loads such as the CPU 910, the baseband IC 912, and the like. It should be noted that the electronic device 900 may be configured as a laptop PC, a digital still camera, a digital video camera, an audio player, or the like.

Description has been made regarding the present disclosure with reference to the embodiments using specific terms. However, the above-described embodiments show only the mechanisms and applications of the present disclosure for exemplary purposes only, and are by no means intended to be interpreted restrictively. Rather, various modifications and various changes in the layout can be made without departing from the spirit and scope of the present invention defined in appended claims.

What is claimed is:

1. A semiconductor integrated circuit comprising:
   a plurality of target pins to be terminated;
   an enable pin; and
   a plurality of termination circuits that correspond to the plurality of target pins, wherein the plurality of termination circuits each comprise:
      a first resistor and a first transistor coupled in series between the corresponding target pin and a ground;
      a second resistor coupled between the corresponding target pin and a control electrode of the first transistor; and
      an enable circuit having an output node coupled to the control electrode of the first transistor, and structured such that (i) when the enable pin is set to a first state, the enable circuit sinks a current from the output node, and (ii) when the enable pin is set to a second state, the enable circuit fixedly sets the output node to a low level,
   wherein the enable circuit comprises:
      a second transistor coupled between the output node and the ground; and
      a bias circuit structured to change a state of the second transistor according to a state of the enable pin.

2. The semiconductor integrated circuit according to claim 1, wherein, when the enable pin is set to the first state, the bias circuit applies a relatively low voltage to a control electrode of the second transistor,
   and wherein, when the enable pin is set to the second state, the bias circuit applies a relatively high voltage to the control electrode of the second transistor.

3. The semiconductor integrated circuit according to claim 1, wherein the bias circuit comprises:
   a third resistor having one end coupled to the target pin; and
   a third transistor having a high-voltage side electrode and a control electrode coupled to the other end of the third resistor, and a low-voltage side electrode coupled to the enable pin.

4. The semiconductor integrated circuit according to claim 3, wherein a back gate of the third transistor is grounded.

5. The semiconductor integrated circuit according to claim 1, wherein the enable pin is set to a low or a high impedance state.

6. The semiconductor integrated circuit according to claim 1, wherein the semiconductor integrated circuit is structured as a Universal Serial Bus (USB) Power Delivery (PD) controller,
   and wherein the plurality of target pins are configured as two Configuration Channel (CC) pins.

7. A semiconductor integrated circuit comprising:
   a plurality of target pins to be terminated;
   an enable pin; and
   a plurality of termination circuits that correspond to the plurality of target pins, wherein the plurality of termination circuits each comprise:
      a first resistor and a first transistor coupled in series between the corresponding target pin and a ground;
      a second resistor coupled between the corresponding target pin and a control electrode of the first transistor; and
      an enable circuit having an output node coupled to the control electrode of the first transistor, and structured such that (i) when the enable pin is set to a first state, the enable circuit sinks a current from the output node, and (ii) when the enable pin is set to a second state, the enable circuit fixedly sets the output node to a low level,
   wherein the enable circuit comprises a current mirror circuit structured to mirror a current that flows from the target pin to the enable pin so as to sink a current from the output node.

8. A semiconductor integrated circuit comprising:
   a plurality of target pins to be terminated;
   an enable pin; and
   a plurality of termination circuits that correspond to the plurality of target pins, wherein the plurality of termination circuits each comprise:
      a first resistor and a first transistor coupled in series between the corresponding target pin and a ground;
      a second resistor coupled between the corresponding target pin and a control electrode of the first transistor; and
      an enable circuit having an output node coupled to the control electrode of the first transistor, and structured such that (i) when the enable pin is set to a first state, the enable circuit sinks a current from the output node, and (ii) when the enable pin is set to a second state, the enable circuit fixedly sets the output node to a low level,
   wherein the plurality of termination circuits each include a Zener diode provided between the control electrode of the first transistor and the ground.

9. A semiconductor integrated circuit comprising:
   a plurality of target pins to be terminated;
   an enable pin; and
   a plurality of termination circuits that correspond to the plurality of target pins, wherein the plurality of termination circuits each comprise:
      a first resistor and a first transistor coupled in series between the corresponding target pin and a ground;
      a second resistor coupled between the corresponding target pin and a control electrode of the first transistor; and
      an enable circuit having an output node coupled to the control electrode of the first transistor, and structured such that (i) when the enable pin is set to a first state, the enable circuit has an output impedance that is larger than that of the second resistor, and (ii) when the enable pin is set to a second state, the enable circuit has an output impedance that is smaller than that of the second resistor,
   wherein the enable circuit comprises:
      a second transistor coupled between the output node and the ground; and
      a bias circuit structured to change a state of the second transistor according to a state of the enable pin.

10. The semiconductor integrated circuit according to claim 9, wherein, when the enable pin is set to the first state, the bias circuit applies a relatively low voltage to a control electrode of the second transistor, and wherein, when the enable pin is set to the second state, the bias circuit applies a relatively high voltage to the control electrode of the second transistor.

11. The semiconductor integrated circuit according to claim 10, wherein the bias circuit comprises:
   a third resistor having one end coupled to the target pin; and
   a third transistor having a high-voltage side electrode and a control electrode coupled to the other end of the third resistor, and a low-voltage side electrode coupled to the enable pin.

12. The semiconductor integrated circuit according to claim 11, wherein a back gate of the third transistor is grounded.

13. The semiconductor integrated circuit according to claim 9, wherein the enable pin is set to a low or a high impedance state.

14. The semiconductor integrated circuit according to claim 9, wherein the semiconductor integrated circuit is structured as a Universal Serial Bus (USB) Power Delivery (PD) controller, and wherein the plurality of target pins are configured as two Configuration Channel (CC) pins.

15. A semiconductor integrated circuit comprising:
   a plurality of target pins to be terminated;
   an enable pin; and
   a plurality of termination circuits that correspond to the plurality of target pins, wherein the plurality of termination circuits each comprise:
      a first resistor and a first transistor coupled in series between a corresponding target pin and a ground;
      a second resistor coupled between the corresponding target pin and a control electrode of the first transistor; and
      an enable circuit having an output node coupled to the control electrode of the first transistor, and structured such that (i) when the enable pin is set to a first state, the enable circuit has an output impedance that is larger than that of the second resistor, and (ii) when the enable pin is set to a second state, the enable circuit has an output impedance that is smaller than that of the second resistor,
   wherein the enable circuit comprises a current mirror circuit structured to mirror a current that flows from the target pin to the enable pin so as to sink a current from the output node.

16. A semiconductor integrated circuit comprising:
   a plurality of target pins to be terminated;
   an enable pin; and
   a plurality of termination circuits that correspond to the plurality of target pins, wherein the plurality of termination circuits each comprise:
      a first resistor and a first transistor coupled in series between a corresponding target pin and a ground;
      a second resistor coupled between the corresponding target pin and a control electrode of the first transistor; and
      an enable circuit having an output node coupled to the control electrode of the first transistor, and structured such that (i) when the enable pin is set to a first state, the enable circuit has an output impedance that is larger than that of the second resistor, and (ii) when the enable pin is set to a second state, the enable circuit has an output impedance that is smaller than that of the second resistor,
   wherein the plurality of termination circuits each include a Zener diode provided between the control electrode of the first transistor and the ground.

* * * * *